(12) United States Patent
Maruko

(10) Patent No.: US 7,141,819 B2
(45) Date of Patent: Nov. 28, 2006

(54) SEMICONDUCTOR PACKAGE

(75) Inventor: Toguto Maruko, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 18 days.

(21) Appl. No.: 10/798,567

(22) Filed: Mar. 12, 2004

(65) Prior Publication Data

US 2004/0232548 A1 Nov. 25, 2004

(30) Foreign Application Priority Data

May 19, 2003 (JP) ............................. 2003-139730

(51) Int. Cl.
*H01L 23/58* (2006.01)
(52) U.S. Cl. ........................................ 257/48; 257/738
(58) Field of Classification Search ................ 257/738, 257/697
See application file for complete search history.

(56) References Cited

U.S. PATENT DOCUMENTS 5,729,894 A * 3/1998 Rostoker et al. ............... 29/832
6,194,782 B1 2/2001 Katchmar
6,815,621 B1 * 11/2004 Park et al. .................. 174/260

FOREIGN PATENT DOCUMENTS

| JP | 5-166901 | 7/1993 |
|----|----------|--------|
| JP | 5-259306 | 10/1993 |
| JP | 9-199555 | 7/1997 |
| JP | 2000-068403 | 3/2000 |
| JP | 2001-308152 | 11/2001 |

* cited by examiner

*Primary Examiner*—Zandra V. Smith
*Assistant Examiner*—Kiesha Rose
(74) *Attorney, Agent, or Firm*—Rabin & Berdo P.C.

(57) ABSTRACT

A semiconductor package 11 which has a plurality of connection terminals 14 to be connected to a board and a plurality of test terminals 15, which usually do not need to be connected to the board and are for performance test by the maker, on a joint surface 12 thereof to the board. Placed in the semiconductor package are a predetermined-pitch area 16 where the connection terminals 14 are arranged at predetermined pitches in a lattice and a narrow-pitch area 17 where the test terminals 15 are arranged at pitches narrower than the predetermined pitches in a lattice.

25 Claims, 8 Drawing Sheets

SEMICONDUCTOR PACKAGE

BACKGROUND OF THE INVENTION

1. Field of the Invention

The present invention relates to a semiconductor package where a semiconductor chip such as an LSI is mounted.

2. Description of the Related Art

In general, there are a BGA (Ball Grid Array), a WCSP (Wafer-level Chip Size Package) and the like as semiconductor packages having solder balls.

FIG. 8 is a bottom view of such a conventional package.

On the bottom 2 of a package 1, an enough number of solder balls 3 to form necessary terminals are arranged at equal pitches. In the example of this figure, 64 terminals are formed.

Meanwhile, Japanese Patent Laid-Open Publication No. 2000-068403 discloses that solder bumps for radiating heat are formed at narrower pitches than solder bumps for connection such that in heat processing for joining to a board, all the solder bumps for radiating heat together form a single joint layer.

U.S. Pat. No. 6,194,782 discloses that in FIG. 5 thereof, solder balls 40 are placed in closer proximity to each other than solder balls 24 which are not positioned under a die.

However, the market requires that pitches of terminals be large and package sizes be small, which are contradictory.

If the pitch is widened without changing the package size, terminals may fall short in number not securing a necessary number of terminals for an LSI or the like.

For example, for a square package of 6.4 mm in dimension, if a user requires that the predetermined pitch be 0.8 mm and the number of necessary terminals (including power, ground, and test terminals) be 95, the prior art of FIG. 8 can secure only 64 terminals, thus not satisfying the requirements.

Meanwhile, the above Japanese Patent Laid-Open Publication and U.S. Patent describe that an area where the pitch of terminals is narrow and an area where the pitch of terminals is wide are provided so that the terminals placed at the narrow pitches are used for radiating and managing heat, but do not at all describe the problem of increasing the number of terminals without enlarging the package size. Moreover, no description at all is made on arranging test terminals at narrow pitches, which usually do not need to be connected to a board.

SUMMARY OF THE INVENTION

In order to solve the above problem, the present invention adopts the following configurations.

According to the present invention, there is provided a semiconductor package which has a plurality of connection terminals to be connected to a board and a plurality of test terminals on a joint surface thereof to the board, wherein a first area where the connection terminals are arranged at predetermined pitches in a lattice and a second area where the test terminals are arranged at pitches narrower than the predetermined pitches in a lattice are placed.

In the semiconductor package, the second area may be placed in the center of the joint surface, and the first area may be placed in the periphery of the joint surface so as to surround the second area.

Further, in the semiconductor package, the second area may be placed in the periphery of the joint surface, and the first area may be placed so as to surround the second area.

In this case, the second area may be placed on layout of a high-heat-buildup circuit mounted.

Moreover, in the semiconductor package, the first area may be formed in a plurality of places, and the second area may be placed so as to isolate the first areas respectively formed in the plurality of places from each other.

In this case, the test terminals in the second area may be mounted on ground.

Furthermore, in the semiconductor package, the second area may be placed in the four corners of the joint surface, and the first area may be placed in an area except for the four corners.

Further, in the semiconductor package, the connection terminals and the test terminals may be formed by solder balls.

Moreover, in the semiconductor package, the connection terminals and the test terminals may be formed by lands.

Further, according to the present invention, there is provided a lead-type semiconductor package which has a plurality of connection leads to be connected to a board and a plurality of test leads, wherein the connection leads are arranged at predetermined pitches, and the test leads are arranged at pitches narrower than the predetermined pitches.

The above and other objects and features of the present invention will become apparent from the following detailed description and the appended claims with reference to the accompanying drawings.

DETAILED DESCRIPTION OF THE PREFERRED EMBODIMENTS

Figure 1:
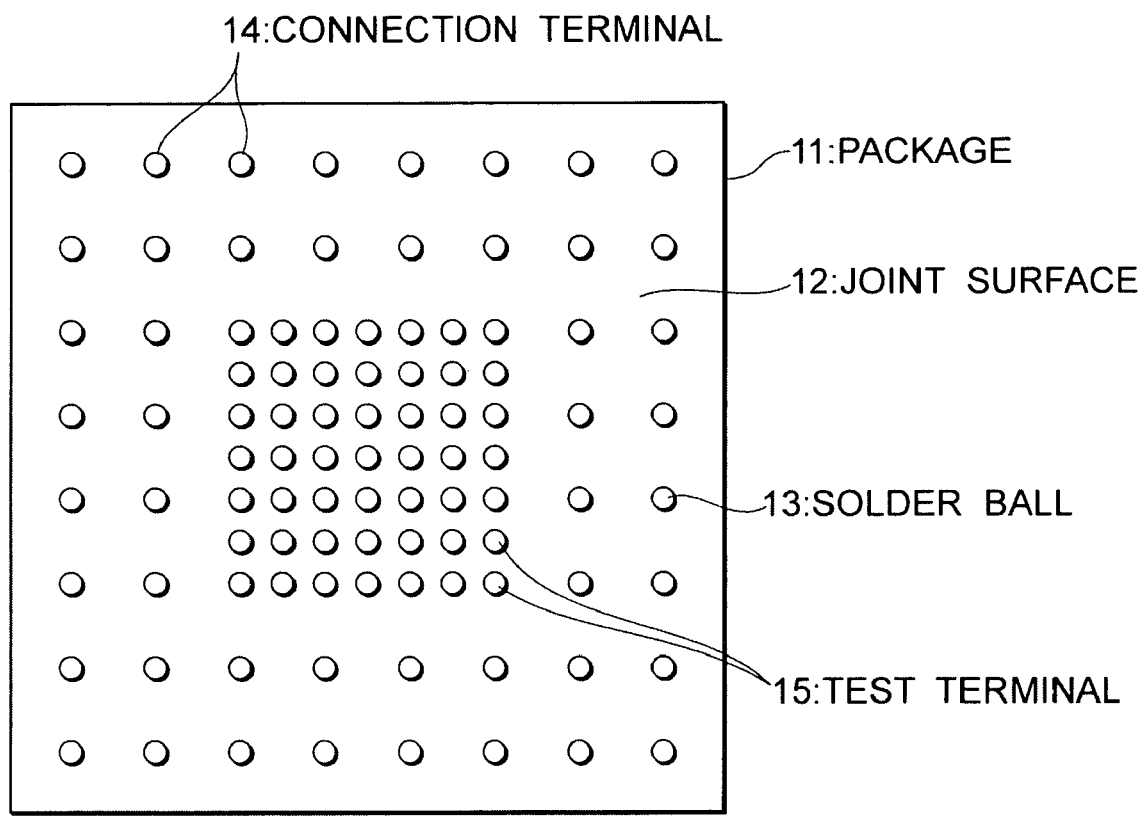
FIG. 1 is a bottom view showing a first embodiment of the present invention.

FIG. 1 is a bottom view showing a first embodiment of the present invention.

On the bottom of a package 11, that is, a joint surface 12 to a board, solder balls 13 are arranged in a lattice.

A plurality of connection terminals 14 formed by solder balls 13 are arranged at predetermined pitches required by a user, in a lattice in the periphery of the joint surface 12.

A plurality of test terminals 15 formed likewise by solder balls 13 are arranged at pitches narrower than the predetermined pitches of the connection terminals 14, in a lattice in the center of the joint surface 12, and are positioned to be surrounded by the connection terminals 14.

When mounting the package 11 on a board such as a printed wiring board, the connection terminals 14 are connected to terminals of the board. In contrast, the test terminals 15 usually do not need to be connected to the board, and are for performance test by the maker before shipping and not for use by users.

It is assumed, for example, that the package 11 is a square of 6.4 mm in dimension, the connection terminals 14 in the periphery are at pitches of 0.8 mm, and the test terminals 15 in the center are at pitches of 0.4 mm, half of the 0.8 mm. Then, the connection terminals 14 are 48 terminals, and the test terminals 15 are 49 terminals. A total of 97 terminals can be provided.

Thus, when a user requires 95 terminals, the requirement can be met.

Figure 2:
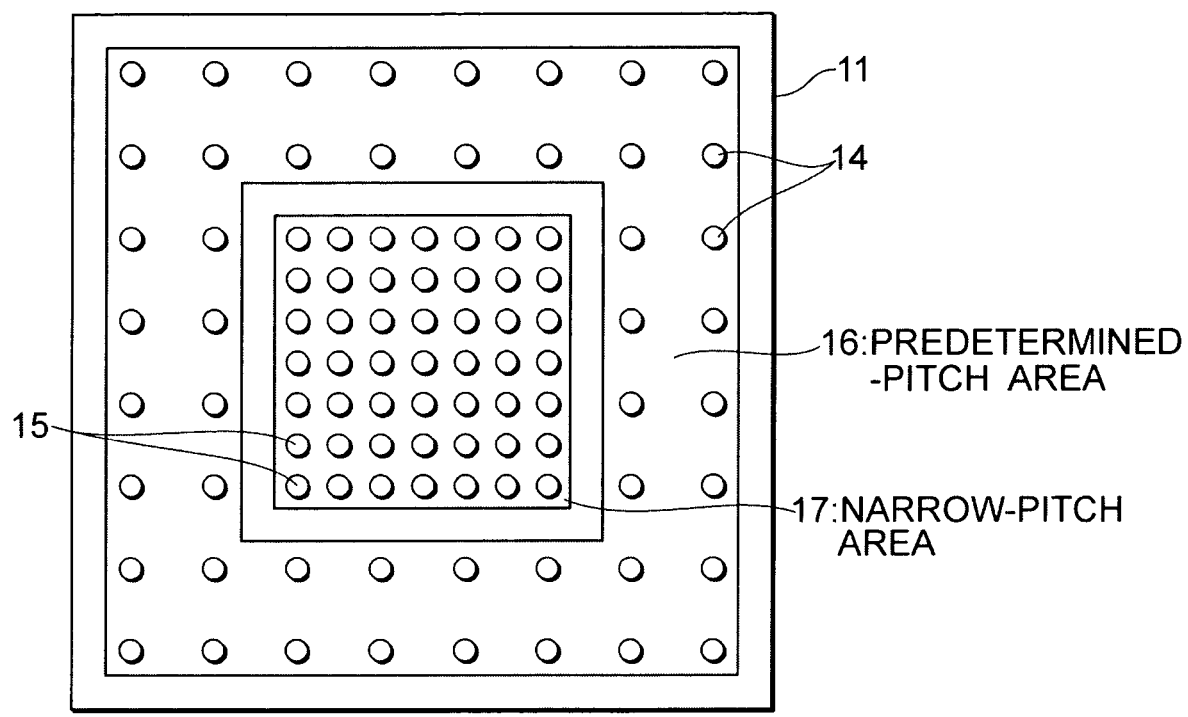
FIG. 2 is a view for explaining a narrow-pitch area.

FIG. 2 is a view for explaining a predetermined-pitch area and a narrow-pitch area.

As described above, the connection terminals 14 are arranged at predetermined pitches in the periphery of the joint surface 12, which area is called a predetermined-pitch area 16 as a first area.

Furthermore, the test terminals 15 are arranged at pitches narrower than the predetermined pitches in the center of the joint surface 12, which area is called a narrow-pitch area 17 as a second area.

Therefore, the narrow-pitch area 17 is placed in the center of the joint surface 12, and the predetermined-pitch area 16 is placed in the periphery of the joint surface 12 so as to surround the narrow-pitch area 17.

When the specification is made to tolerate that short circuit may occur between adjacent test terminals 15 in the narrow-pitch area 17, a user can mount the package 11 on a board even with a mounting technology for 0.8 mm.

Since the test terminals 15 are for test by the maker before shipping and the test is completed at the stage of mounting, there is no problem with making the specification tolerate that short circuit may occur.

As described above, according to the first embodiment, the connection terminals to be connected to a board are arranged at predetermined pitches while the test terminals, which do not need to be connected to the board and which are for performance test by the maker, are arranged at pitches narrower than the predetermined pitches. Thus, the number of terminals can be increased even with a package of the same size.

Moreover, when the number of terminals is the same, the size of the package can be reduced.

Furthermore, for the test terminals in the narrow-pitch area, the specification can be made to tolerate that short circuit may occur between adjacent terminals when mounting the package on a board. Thus, no problem occurs when mounting the package on a board.

Figure 3:
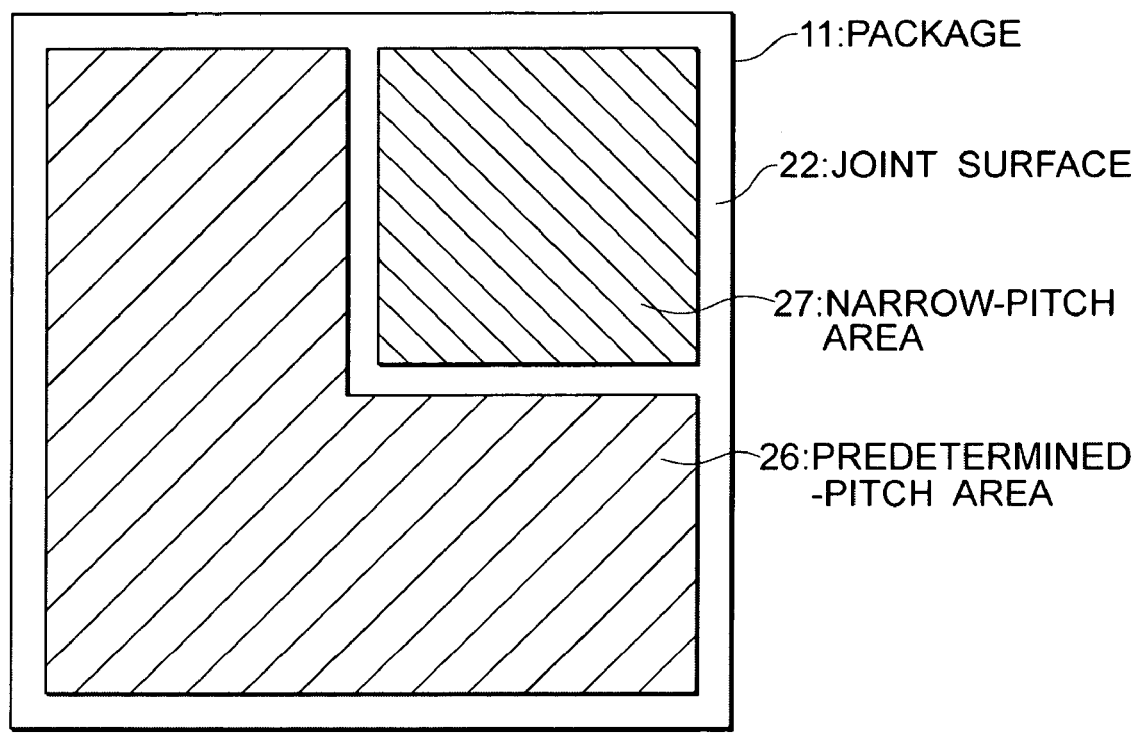
FIG. 3 is a bottom view showing a second embodiment of the present invention.

FIG. 3 is a bottom view showing a second embodiment of the present invention.

The second embodiment is the same as the first embodiment in terms of the number of terminals and the like, except that the arrangement of a predetermined-pitch area 26 and a narrow-pitch area 27 is different.

In the second embodiment, the narrow-pitch area 27 is placed in the periphery of a joint surface 22 of a package 21, and the predetermined-pitch area 26 is shaped like an L and placed so as to surround the narrow-pitch area 27.

Alternatively, it may be that the narrow-pitch area 27 is placed not in a corner but in the center or the like of one side, and that the predetermined-pitch area 26 is shaped like a U and placed so as to surround the narrow-pitch area 27.

Figure 4A:
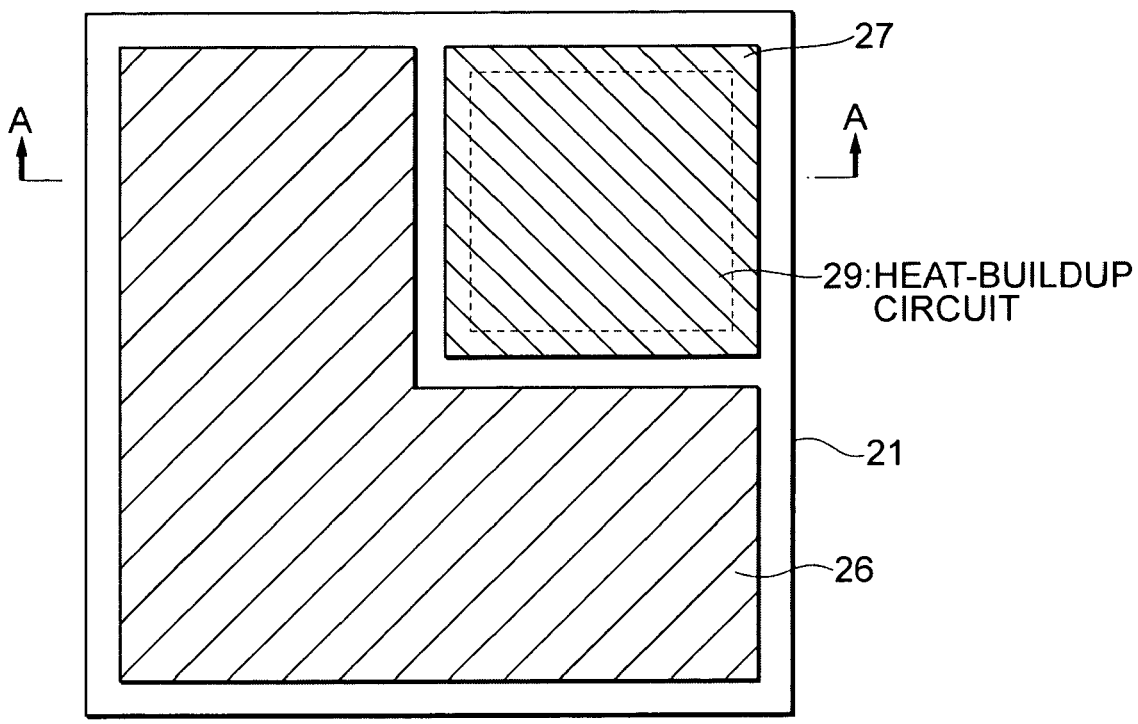
FIG. 4 shows an application example of the second embodiment.
Figure 4B:
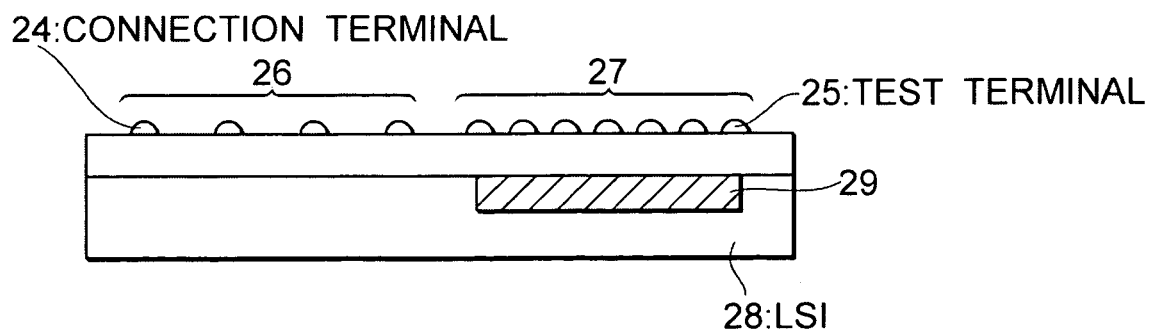

FIG. 4 shows an example where the second embodiment is applied to the WCSP, where (a) is a bottom view and (b) is a cross-sectional view on line A—A.

The narrow-pitch area 27 is placed on the layout of a high-heat-buildup circuit 29 such as an analog circuit or a driver circuit of an LSI 28 mounted on the package 21.

Although test terminals 25 of the narrow-pitch area 27 are usually not connected to a board, with this configuration, because test is completed by the maker before shipping, a user may mount the package 21 on a board with all test terminals 25 being connected to a large ground terminal of the board, so that heat from the heat-buildup circuit 29 can radiate through the narrow-pitch area 27, thereby reducing heat buildup of the LSI 28.

Note that herein, the term "all test terminals" actually refers to all of test terminals without excluding any terminal such as a ground, power supply, or open terminal.

As described above, according to the second embodiment, all test terminals of the narrow-pitch area can be mounted on ground of a board, which produces the effect that the capability of the mounted package to radiate heat is improved, in addition to the effect of the first embodiment.

Figure 5:
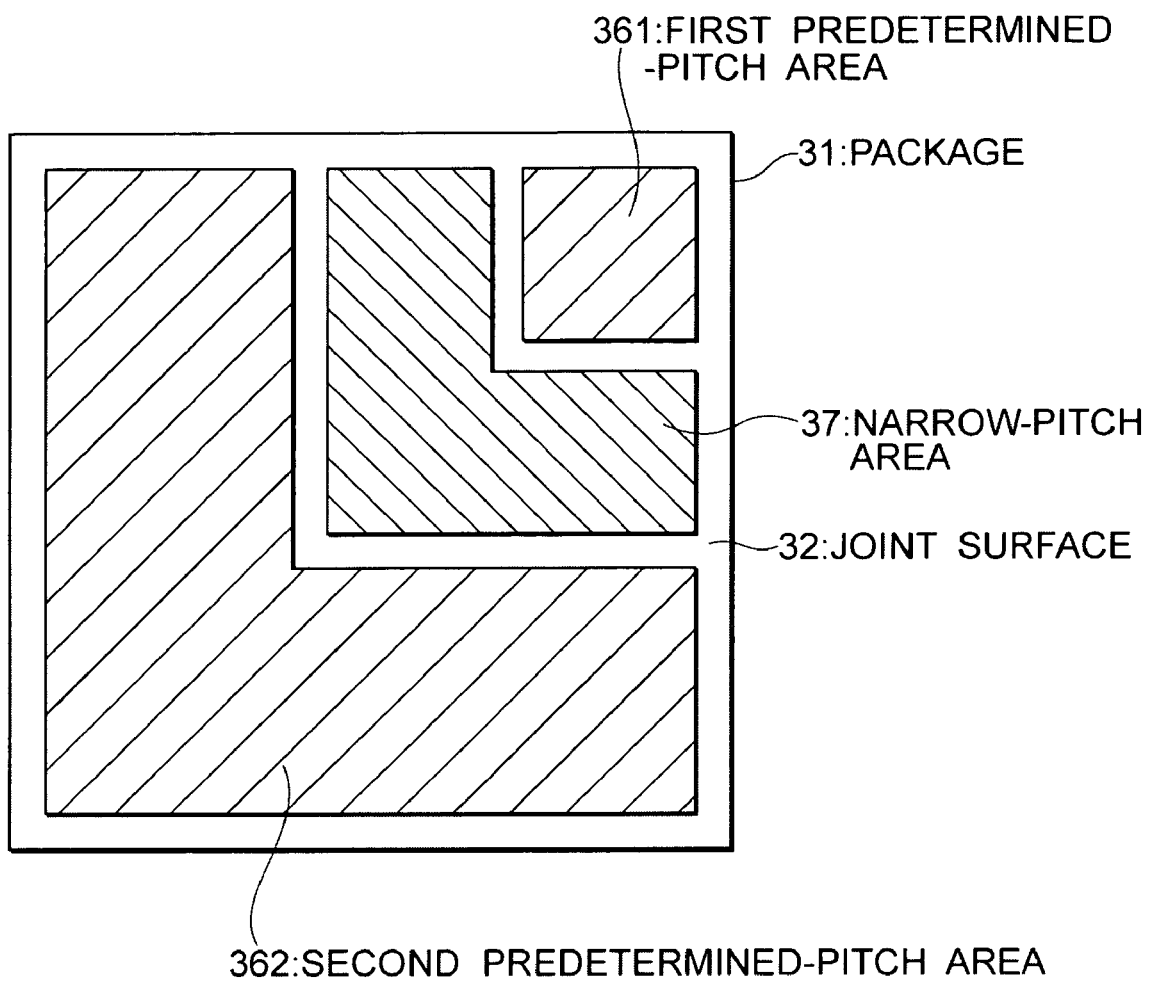
FIG. 5 is a bottom view showing a third embodiment of the present invention.

FIG. 5 is a bottom view showing a third embodiment of the present invention.

The third embodiment is the same as the first embodiment in terms of the number of terminals and the like, except that the arrangement of a first predetermined-pitch area 361, a second predetermined-pitch area 362, and a narrow-pitch area 37 is different.

In the third embodiment, predetermined-pitch areas are formed in two places, but the number of terminals is the same as in the first embodiment.

The first predetermined-pitch area 361 is placed in the periphery of a joint surface 32 of a package 31.

The narrow-pitch area 37 is shaped like an L and placed so as to surround the first predetermined-pitch area 361.

The second predetermined-pitch area 362 is shaped like an L and placed so as to surround the narrow-pitch area 37 and is isolated by the narrow-pitch area 37 from the first predetermined-pitch area 361.

Alternatively, it may be that the first predetermined-pitch area 361 is placed not in a corner but in the center or the like of one side, that the narrow-pitch area 37 is shaped like a U and placed so as to surround the first predetermined-pitch area 361, and also that the second predetermined-pitch area 362 is shaped like a U and placed so as to surround the narrow-pitch area 37.

If all test terminals of the narrow-pitch area 37, which are usually not connected to a board, are mounted on ground of a board when mounting the package 31 having this configuration on the board, a ground shield is formed in between the first and second predetermined-pitch areas 361, 362.

For example, in the case of an LSI having analog circuits and digital circuits integrated thereon, resistance against noise can be expected to be improved by using the first predetermined-pitch area 361 for digital signal terminals of the digital circuits, and the second predetermined-pitch area 362 for analog signal terminals.

As described above, according to the third embodiment, all test terminals of the narrow-pitch area, which are usually not connected to a board, can be mounted on ground of a board, in which case a ground shield is formed in between the first and second predetermined-pitch areas, and thus resistance against noise can be expected to be improved in addition to the effect of the first embodiment.

Figure 6:
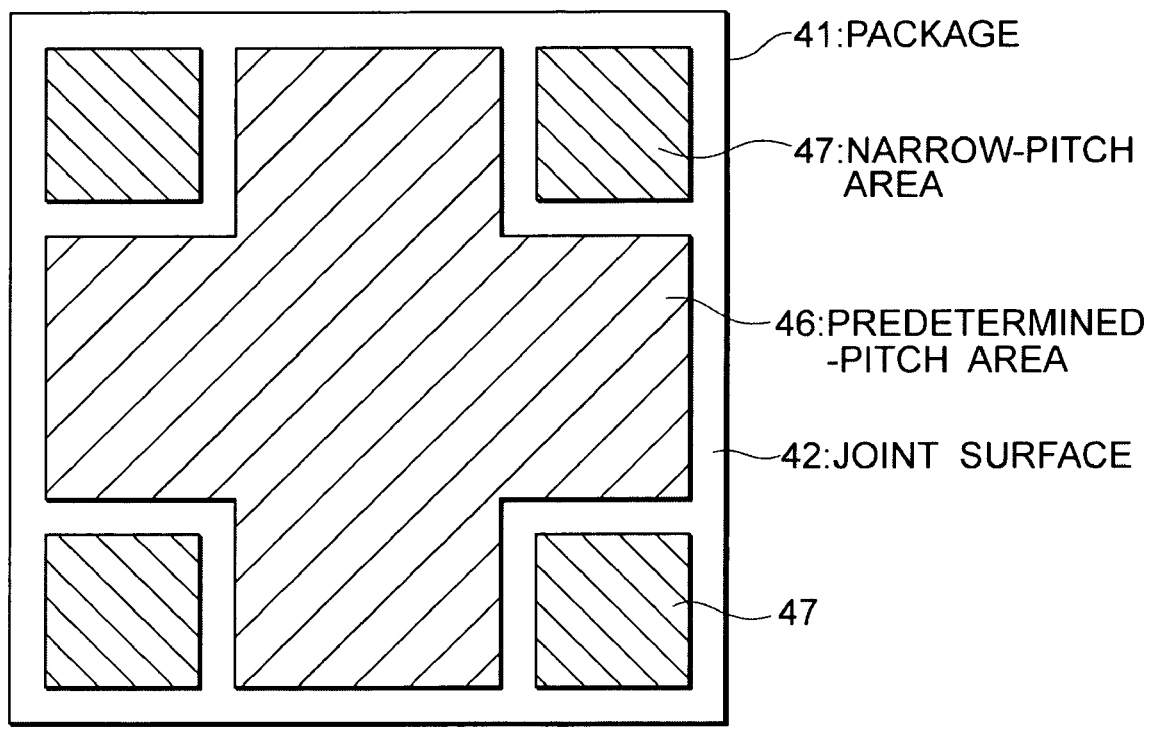
FIG. 6 is a bottom view showing a fourth embodiment of the present invention.

FIG. 6 is a bottom view showing a fourth embodiment of the present invention.

The fourth embodiment is the same as the first embodiment except that the arrangement of a predetermined-pitch area 46 and narrow-pitch areas 47, and the number of terminals, are different.

In the fourth embodiment, the narrow-pitch areas 47 are formed in four places, and the total number of test terminals is 48, which can be equally divided into four, almost the same as in the first embodiment.

The narrow-pitch areas 47 are placed in the four corners of a joint surface 42 of a package 41, and the predetermined-pitch area 46 is shaped like a cross and placed uncovering the four corners of the joint surface 42.

If all test terminals of the narrow-pitch areas 47, which are usually not connected to a board, are mounted on ground of a board when mounting the package 41 having this configuration on the board, the number of terminals mounted increases in the four corners of the joint surface 42 compared with the prior art.

As described above, according to the fourth embodiment, all test terminals of the narrow-pitch areas in the four corners of the package can be mounted on ground of a board, in which case the number of terminals mounted in the four corners increases. Thus, resistance to the warp of the board and the LSI is strengthened, thereby improving the reliability in mounting the package in addition to the effect of the first embodiment.

Note that while the first to fourth embodiments describe the cases where the connection terminals and the test terminals are formed by solder balls, the present invention can be applied to a package of which such terminals are formed by lands such as an LGA (Land Grip Array).

Figure 7:
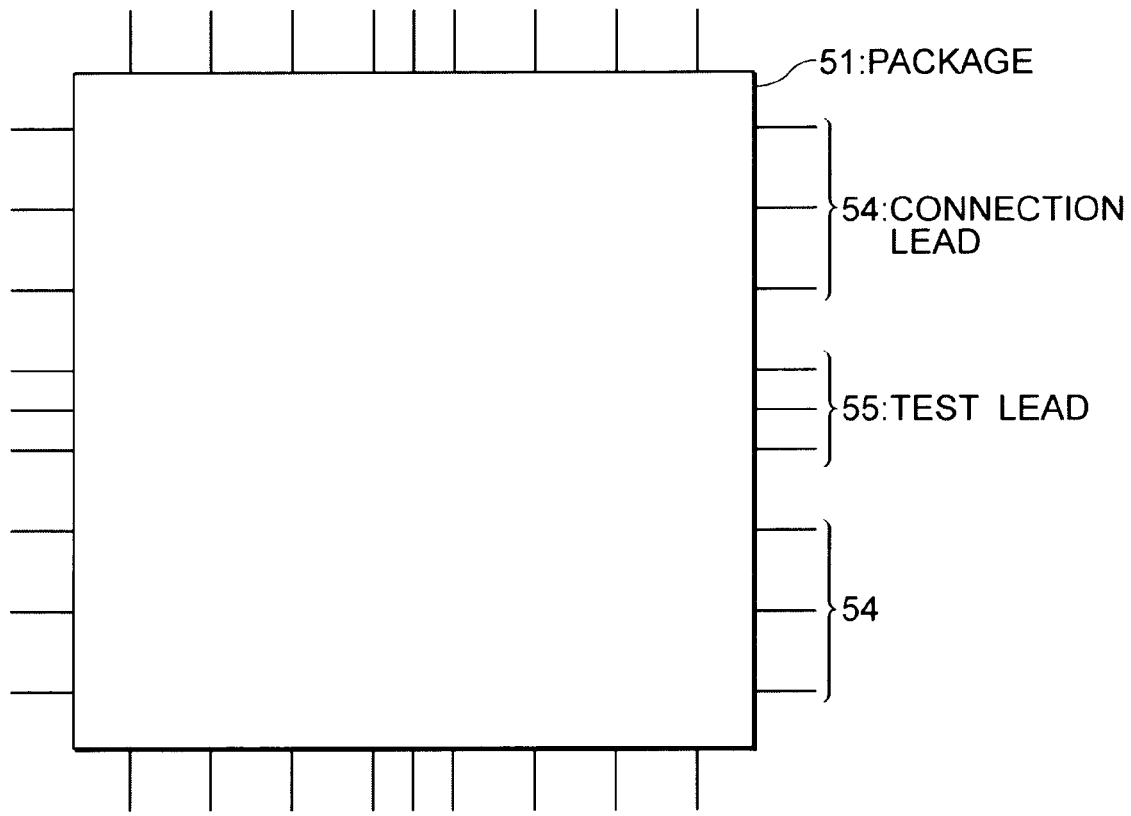
FIG. 7 is a plan view showing a fifth embodiment of the present invention.
Figure 8:
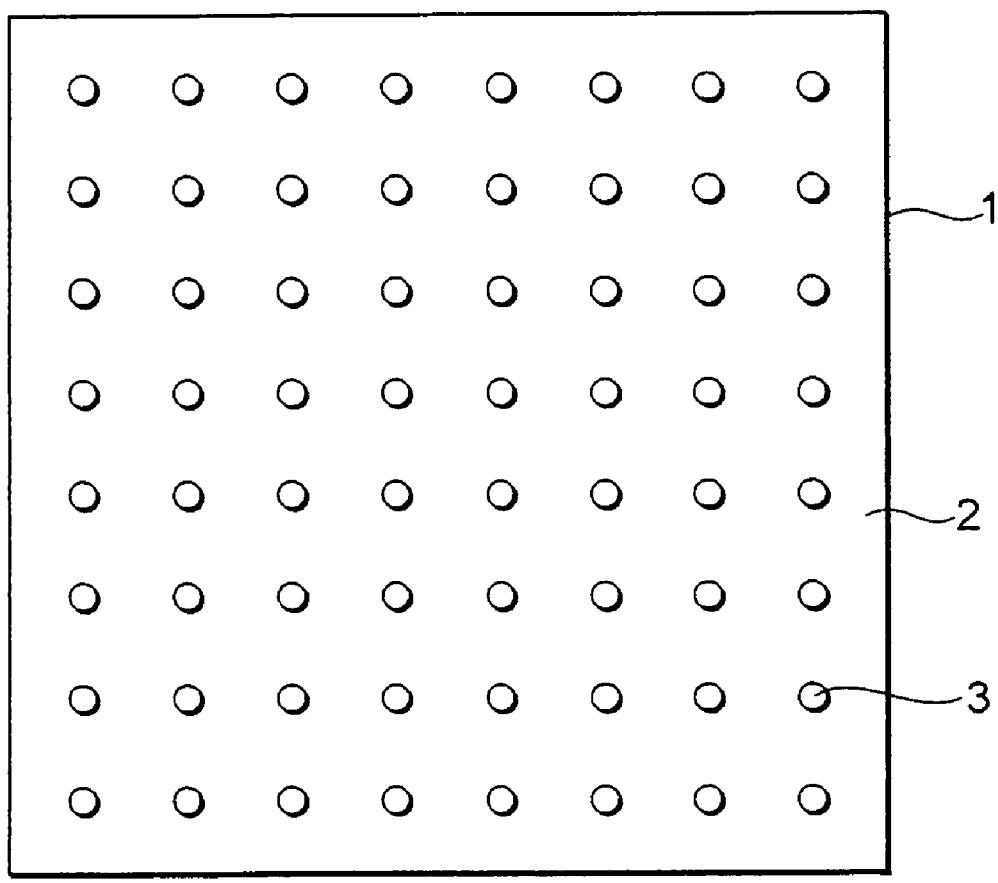
FIG. 8 is a bottom view of a conventional package.

FIG. 7 is a plan view showing a fifth embodiment of the present invention.

The fifth embodiment is an example where the present invention is applied to a lead-type semiconductor package such as a QFP (Quad Flat Package), a SOJ (Small Outline J-leaded Package), a DIP (Dual In-Line Package) or the like. The connection terminals described in the above embodiments are formed by connection leads 54 and the test terminals are formed by test leads 55.

FIG. 7 shows an example of the QFP. The plurality of connection leads 54 are provided on the sides of a package 51 and the plurality of test leads 55 are provided in the centers of the four sides to be surrounded by the connection leads 54.

The connection leads 54 are arranged at predetermined pitches, and the test leads 55 are arranged at pitches narrower than the predetermined pitches, for example, half-pitches, thereby increasing the number of test leads 55.

Note that the test leads 55 may be arranged not in the centers of the four sides but at the ends thereof and that positions where to be placed are selected according to requirements when designing the LSI.

As described above, according to the fifth embodiment, applying the present invention to lead-type semiconductor packages produces the same effect as the first embodiment.

As described above, according to the present invention, because connection terminals are arranged at predetermined pitches and test terminals are arranged at pitches narrower than the predetermined pitches, the number of terminals can be increased even with a package of the same size.

Although the preferred embodiments of the present invention have been described in detail, it should be understood that various changes, substitutions and alterations can be made therein without departing from the spirit and scope of the invention as defined by the appended claims.

What is claimed is:

1. A semiconductor package for a semiconductor chip, said semiconductor package having a surface with a plurality of test terminals for use during testing of said semiconductor chip and with a plurality of connection terminals for connection to wiring on a board after testing, said test terminals being electrically isolated from said wiring on said board,
wherein said connection terminals are arranged in a first area at predetermined pitches in a lattice and said test terminals are arranged in a second area at pitches narrower than said predetermined pitches in a lattice.

2. The semiconductor package according to claim 1, wherein said connection terminals and said test terminals are formed by solder balls.

3. The semiconductor package according to claim 1, wherein said connection terminals and said test terminals are formed by lands.

4. The semiconductor package according to claim 1, wherein said second area is placed in the center of said surface, and said first area is placed in the periphery of said surface so as to surround said second area.

5. The semiconductor package according to claim 4, wherein said connection terminals and said test terminals are formed by solder balls.

6. The semiconductor package according to claim 4, wherein said connection terminals and said test terminals are formed by lands.

7. The semiconductor package according to claim 1, wherein said second area is placed in the periphery of said surface, and said first area is placed so as to surround said second area.

8. The semiconductor package according to claim 7, wherein said connection terminals and said test terminals are formed by solder balls.

9. The semiconductor package according to claim 7, wherein said connection terminals and said test terminals are formed by lands.

10. The semiconductor package according to claim 7, wherein said second area is placed where a high-heat-buildup circuit is disposed.

11. The semiconductor package according to claim 10, wherein said connection terminals and said test terminals are formed by solder balls.

12. The semiconductor package according to claim 10, wherein said connection terminals and said test terminals are formed by lands.

13. The semiconductor package according to claim 1, wherein said first area is formed in a plurality of places, and said second area is placed so as to isolate said first areas respectively formed in said plurality of places from each other.

14. The semiconductor package according to claim 13, wherein said connection terminals and said test terminals are formed by solder balls.

15. The semiconductor package according to claim 13, wherein said connection terminals and said test terminals are formed by lands.

16. A semiconductor package for a semiconductor chip, said semiconductor package having a surface with a plurality of connection terminals to be connected to wiring on a board and with a plurality of test terminals for testing the semiconductor chip before the connection terminals are connected to the wiring on the board and for connection to a ground on the board when the connection terminals are connected to the wiring on the board,
wherein said connection terminals are arranged in a first area at predetermined pitches in a lattice and said test terminals are arranged in a second area at pitches narrower than said predetermined pitches in a lattice.

17. The semiconductor package according to claim 16, wherein said connection terminals and said test terminals are formed by solder balls.

18. The semiconductor package according to claim 16, wherein said connection terminals and said test terminals are formed by lands.

19. The semiconductor package according to claim 1, wherein said surface is rectangular and said second area is placed in the four corners of said rectangular surface, and said first area is placed in an area except for said four corners.

20. The semiconductor package according to claim 19, wherein said connection terminals and said test terminals are formed by solder balls.

21. The semiconductor package according to claim 19, wherein said connection terminals and said test terminals are formed by lands.

22. A lead-type semiconductor package for a semiconductor chip, said semiconductor package having a plurality of test leads for use during testing of said semiconductor chip and having a plurality of connection leads for connection to a wiring board after testing, said test leads being electrically isolated from the wiring on said board, wherein said connection leads are arranged at predetermined pitches, and said test leads are arranged at pitches narrower than said predetermined pitches.

23. A semiconductor device having the semiconductor package of claim 1, in combination with the board and mounted on the board.

24. A semiconductor device having the semiconductor package of claim 16, in combination with the board and mounted on the board.

25. A semiconductor device having the semiconductor package of claim 22, in combination with the board and mounted on the board.

* * * * *

UNITED STATES PATENT AND TRADEMARK OFFICE
CERTIFICATE OF CORRECTION

PATENT NO. : 7,141,819 B2
APPLICATION NO. : 10/798567
DATED : November 28, 2006
INVENTOR(S) : Tuguto Maruko Page 1 of 1

It is certified that error appears in the above-identified patent and that said Letters Patent is hereby corrected as shown below:

Title page
In item (75) in the heading of the Patent, the inventor's name should be spelled "Tuguto MARUKO."

Signed and Sealed this

Tenth Day of April, 2007

JON W. DUDAS
*Director of the United States Patent and Trademark Office*